(12) United States Patent
Corbeij et al.

(10) Patent No.: US 8,497,976 B2
(45) Date of Patent: Jul. 30, 2013

(54) SUBSTRATE MEASUREMENT METHOD AND APPARATUS

(75) Inventors: Wilhelmus Maria Corbeij, Eindhoven (NL); Arie Jeffrey Den Boef, Waalre (NL); Everhardus Cornelis Mos, Best (NL)

(73) Assignee: ASML Netherlands B.V., Veldhoven (NL)

( * ) Notice: Subject to any disclaimer, the term of this patent is extended or adjusted under 35 U.S.C. 154(b) by 708 days.

(21) Appl. No.: 12/574,231

(22) Filed: Oct. 6, 2009

(65) Prior Publication Data

US 2010/0091258 A1    Apr. 15, 2010

Related U.S. Application Data

(60) Provisional application No. 61/136,832, filed on Oct. 7, 2008.

(51) Int. Cl.
| | |
|---|---|
| *G01B 11/00* | (2006.01) |
| *G01N 21/86* | (2006.01) |
| *G03B 27/32* | (2006.01) |
| *G03B 27/42* | (2006.01) |
| *G03B 27/54* | (2006.01) |

(52) U.S. Cl.
USPC ............ 355/67; 250/559.01; 355/53; 355/77; 356/399

(58) Field of Classification Search
USPC ....... 250/548, 559.01–559.08, 559.29–559.3, 250/559.32, 559.44; 310/12.05–12.06; 348/131–132, 135, 142; 355/53, 67–68, 71, 355/77; 356/399–401, 612, 614–616, 622; 382/147, 151
See application file for complete search history.

(56) References Cited

U.S. PATENT DOCUMENTS

| | | | |
|---|---|---|---|
| 2004/0239946 A1* | 12/2004 | Kane et al. | 356/497 |
| 2005/0110965 A1* | 5/2005 | Hendriks et al. | 355/18 |
| 2007/0013921 A1* | 1/2007 | Pellemans et al. | 356/625 |
| 2008/0015448 A1* | 1/2008 | Keely et al. | 600/477 |
| 2008/0056560 A1* | 3/2008 | Yu et al. | 382/147 |
| 2009/0097008 A1* | 4/2009 | Mos et al. | 355/71 |

FOREIGN PATENT DOCUMENTS

JP    2007-010666    1/2007

OTHER PUBLICATIONS

Japanese Office Action for Japanese Patent Application No. 2009-220520, mailed on Nov. 8, 2011.
Koheras The Power of Fiber Laser Technology, Laser Sources designed for high-end applications in industry and scientific research, Product Catalog 2007, pp. 2 and 7.

* cited by examiner

*Primary Examiner* — Toan Ton
*Assistant Examiner* — Colin Kreutzer
(74) *Attorney, Agent, or Firm* — Pillsbury Winthrop Shaw Pittman LLP

(57) ABSTRACT

A method and apparatus for measurement of a characteristic of a substrate. A target is present on the substrate and a measurement is performed during a scanning movement of the substrate. The scanning movement of the substrate is a linear movement and the measurement includes obtaining a reflected image of the target using a pulsed light source, the duration of a single light pulse being less than 100 psec. A lithographic apparatus includes such a measurement apparatus, and a device manufacturing method includes such a measurement method.

9 Claims, 2 Drawing Sheets

SUBSTRATE MEASUREMENT METHOD AND APPARATUS

CROSS-REFERENCE TO RELATED APPLICATIONS

This application claims the benefit of priority from U.S. Provisional Patent Application No. 61/136,832, filed on Oct. 7, 2008, the entire content of which is incorporated herein by reference.

FIELD

The present invention relates to a method for measurement of a characteristic of a substrate, a measurement apparatus, a lithographic apparatus, and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

During acquisition of images in a measurement process used in a lithography apparatus, throughput of the measurement stage is limited by the requirement for the target image to come to an (approximate) stand-still in order to get the required image quality. This results in a number of accelerations and decelerations of the substrate during a measurement period.

SUMMARY

It is desirable to obtain a measurement method and apparatus for measuring characteristics of substrates in a lithography process, which has improved throughput speed.

According to an aspect of the invention, there is provided a method for measurement of a characteristic of a substrate, comprising providing a target on the substrate, performing a measurement during a scanning movement of the substrate, wherein the scanning movement of the substrate is a linear movement (i.e. a steady, single fixed speed, no acceleration/deceleration) and wherein the measurement comprises obtaining a reflected image of the target using a pulsed light source, the duration of a single light pulse being less than 100 psec.

According to an aspect of the invention, there is provided a method for measurement of a characteristic of a substrate. The method includes performing a measurement during a linear scanning movement of a substrate, wherein the measurement comprises obtaining a reflected image of a target on the substrate using a pulsed light source, the duration of a single light pulse being less than 100 psec.

It is noted that measurement of a characteristic of a substrate is in this document understood to comprise determining a process related parameter, such as Critical Dimension (CD), overlay measurement, but also relates to e.g. alignment measurements of a substrate (e.g. in a lithographic apparatus), determining the position of measurement targets on the substrate, and other measurements involving a substrate.

According to an aspect of the invention, there is provided a measurement apparatus configured to obtain a characteristic of a substrate. The measurement apparatus includes a light source configured to illuminate a target on a substrate, and a detector configured to obtain a reflected image from the target during a scanning movement of the substrate. The scanning movement of the substrate is a linear movement, and the light source is a pulsed light source, the duration of a single light pulse being less than 100 psec.

According to an aspect of the invention, there is provided a lithographic apparatus arranged to transfer a pattern from a patterning device onto a substrate, wherein the lithographic apparatus comprises a measurement apparatus according to an embodiment of the present invention.

According to an aspect of the invention, there is provided a device manufacturing method comprising transferring a pattern from a patterning device onto a substrate, wherein the method further comprises a method for measurement of a characteristic of a substrate according to one of the present invention embodiments.

According to an aspect of the invention, there is provided a method for measuring of a characteristic of a substrate. The method includes obtaining a reflected image of a target on the substrate during a linear scanning movement of the substrate using a pulsed light source, the duration of a single light pulse being less than 100 psec.

According to an aspect of the invention, there is provided a lithographic apparatus that includes a substrate support configured to support a substrate, a projection system configured to transfer a pattern from a patterning device onto the substrate, and a measurement apparatus configured to measure a characteristic of the substrate. The measurement apparatus includes a pulsed light source configured to illuminate a target on the substrate, the duration of a single light pulse being less than 100 psec, and a detector configured to obtain a reflected image from the target during a linear scanning movement of the substrate.

According to an aspect of the present invention, there is provided a device manufacturing method that includes transferring a pattern from a patterning device onto a substrate, and measuring a characteristic of the substrate by obtaining a reflected image of a target on the substrate during a linear scanning movement of the substrate using a pulsed light source, the duration of a single light pulse being less than 100 psec.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
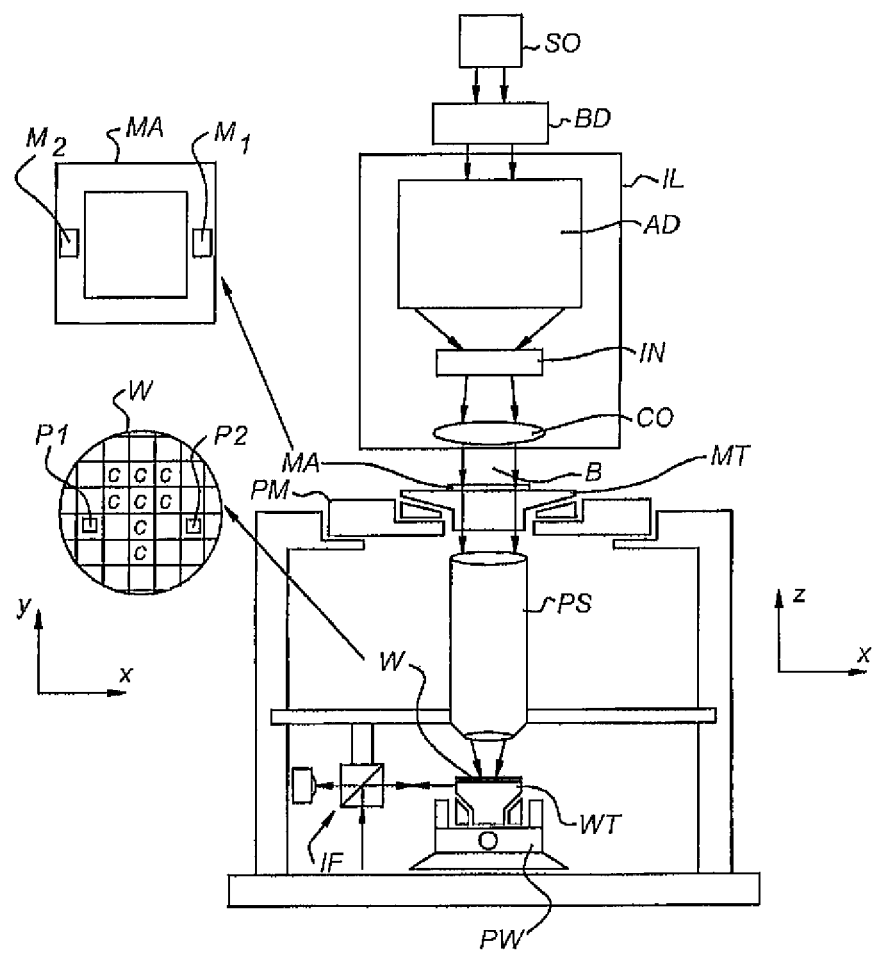
FIG. 1 depicts a lithographic apparatus according to an embodiment of the invention.

FIG. 1 schematically depicts a lithographic apparatus according to one embodiment of the invention. The apparatus comprises: an illumination system (illuminator) IL configured to condition a radiation beam B (e.g. UV radiation or DUV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In the above described lithographic apparatus, several measurements take place before the actual exposure step, such as alignment of the substrate W with respect to the mask M, but also critical dimension (CD) measurement and overlay measurements. In general, for these measurements, targets 12 are provided on the substrate W (see FIG. 2), which are illuminated using a light source, and subsequently, radiation scattered from the target 12 is detected and processed, e.g. by obtaining a reflected image of the target 12. In general, coherent light sources are used, such as lasers.

The measurement processes are usually done for a large number of targets 12 on a substrate W, and the substrate W is moved from target 12 to target 12 for a next measurement, i.e. a measurement is performed during a scanning movement of the substrate W. This process involves accelerating and decelerating the substrate W (or wafer table WT) from target 12 to target 12.

Figure 2:
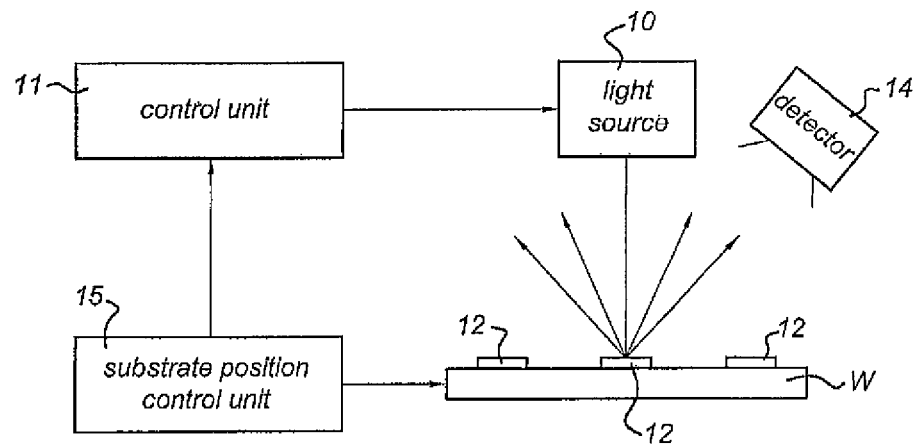
FIG. 2 depicts a schematic view of an embodiment of a measurement apparatus according to an embodiment of the present invention.

According an embodiment of the present invention, the measurement process is carried out 'on the fly', that is with a linear movement of the substrate W. Linear movement in this context means a steady, single speed of movement, without acceleration or deceleration. The measurement is carried out using a pulsed light source 10 as depicted in FIG. 2 which depicts a schematic view of a measurement assembly in, for example, a lithographic apparatus. FIG. 2 shows the substrate W which is provided with a number of measurement targets 12, and which is moved using a substrate position control unit 15. The substrate position control unit 15 may be, for example, a known wafer/wafer table movement system, that includes linear motors and sensors to control the position of the wafer. Precise position information of the substrate W position may be obtained using interferometer based position detection systems.

The light source 10 is controlled by control unit 11, which receives information on the position (and/or other parameters such as speed or acceleration) of the substrate W from the substrate position control unit 15. A detector 14 is provided to gather measurement data, e.g. an image of the target 12 on the substrate W, and may include a CCD camera or the like, which is configured to obtain an image from backscatter radiation from the target 12.

The light source 10 is a pulsed, coherent light source, e.g. a white light laser, also known as a super continuum light source. The light source 10 is able to provide pulses of light over a range of wavelengths, with a continuous level of power over all wavelengths in the range. Furthermore, the emitted light is also coherent, in order to allow various measurements requiring coherent light, such as when using grating targets 12. The light source 10 emits light which (relative to regular laser radiation sources having a single wavelength emitted radiation with a narrow line width) has a short coherence length, e.g. in the order of several centimeters.

The pulse length of the emitted light pulses is less than 100 psec, and may be less than 10 psec. This allows to virtually freeze a movement of substrate W for measurement purposes. When an image is obtained of the target 12 using detector 14, artifacts in the image caused by, for example, smearing or movement unsharpness are sufficiently low to allow further processing of the image. When the substrate W is moving with a speed of 3-10 m/s, a pulse length of 100 psec will result in a movement of the substrate W during exposure to the measurement beam of 0.3 to 1 nm. This allows measurements with sufficient accuracy in lithographic applications.

The light pulse emitted by the light source 10 has a large enough intensity to allow the relevant measurement to be made (e.g. by obtaining an image). Integrating sufficient photons on a light sensitive surface of detector 14 (camera, image intensifier, silicon sensor, etc.) during a very short time of the pulse is achievable when the intensity of the pulse is sufficient. In an exemplary implementation, the light source 10 provides an output beam with 4 mW/nm power density over a wavelength range from 460-850 nm, with pulses of 5 psec. The light source 10 may be emitting power in an even wider wavelength range, e.g. between 460 nm and 2400 nm.

In an embodiment, the control unit 11 synchronizes the pulses of light emitted by the light source 10 with the position of the substrate W using data from the substrate position control unit 15 (such as position and/or timing data). The light source 10 is then synchronized to emit a light pulse 'hitting' the target 12 on the substrate W. The control unit 11 may be arranged to take into account control delays and behavior of the light source 10 to accurately synchronize the light source 10. Feedback and feed forward control algorithms may be used.

For various types of measurements, such as alignment in which multiple targets 12 are used, embodiments of the invention allow the substrate W to move with a constant speed, without any acceleration or deceleration between measurement moment. This may result in much less vibration of the substrate W (and wafer table WT) since rapid accelerations and brake actions may be avoided. Also it would allow the use of less expensive drive electronics because of less dissipation in the linear motors used to move the substrate W, and less thermal drift.

In an embodiment, the control unit 11 may be further arranged to adapt the repetition frequency or repetition rate of the light source 10 to the substrate movement speed, such that the pulses emitted strike subsequent targets 12 on the moving substrate W. For example, in alignment measurements, a number of targets 12 that are provided a distance apart in scribe lane spaces on a substrate W are subsequently scanned on the substrate W. Using an embodiment of the present invention, a scribe lane on a substrate W can be scanned using a linear movement, without any acceleration/deceleration of the substrate W. The repetition frequency may be in the higher than 10 MHz (e.g. 80 MHz), which with a movement speed of 10 m/s of the substrate W corresponds to 1 µm distance on the substrate W.

Using an embodiment of the present invention, the throughput rate of substrates W in a lithographic apparatus may be improved and/or more targets 12 on the substrate W may be measured in the same time period.

Figure 3:
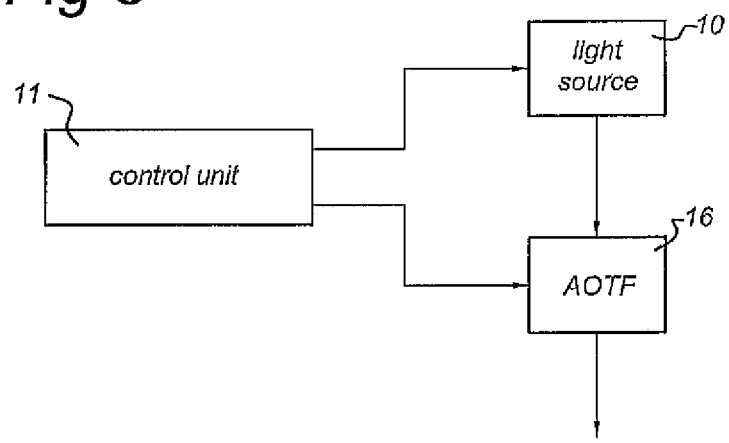
FIG. 3 depicts a schematic view of a further embodiment of a measurement apparatus according to an embodiment of the present invention.

The pulsed light source 10 may also be used for other measurements that use emitted radiation with one or more wavelengths. The embodiment shown schematically in FIG. 3 may be used to select one or more discrete wavelengths from the wavelength range of the light emitted by the super continuum light source 10. This may be obtained in the illustrated embodiment using a tunable filter, such as an acousto-optical tunable filter (AOTF) 16, controlled by the control unit 11. Commercially available AOTF's 16 can select up to 8 discrete wavelengths, with a predefined line width. It will be apparent that also other types of filters or wavelength selection devices may be used to obtain similar effects.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A measurement apparatus for obtaining a characteristic of a substrate, the apparatus comprising:
  a light source configured to illuminate a target on a substrate; and
  a detector configured to obtain a reflected image from the target during a linear scanning movement of the substrate, wherein the linear scanning movement of the substrate is a steady, single speed of movement without acceleration or deceleration, and
  wherein the light source is a pulsed light source, the duration of a single light pulse being less than 100 psec and a repetition rate of the pulsed light source is within a range of 10-100 MHz.

2. The measurement apparatus of claim 1, further comprising a control unit connected to the light source and to a substrate position control unit configured to provide data related to a speed of the substrate movement, wherein the control unit is arranged to adapt a repetition rate of the pulsed light source to the speed of the substrate movement.

3. The measurement apparatus of claim 2, wherein the control unit is further arranged to adapt the repetition rate to a distance between two successive targets and the speed of the substrate movement.

4. The measurement apparatus of claim 1, further comprising a control unit connected to the light source and to a substrate position control unit configured to provide data related to a speed of the substrate movement, wherein the control unit is arranged to synchronize the pulsed light source and movement of the substrate.

5. The measurement apparatus of claim 1, wherein the pulsed light source is a coherent light source configured to emit power in a first wavelength range.

6. The measurement apparatus of claim 1, further comprising a control unit connected to the light source and to a tunable filter configured to receive an output beam of the light source and connected to the control unit, the control unit being further arranged to select one or more spectral wavelengths.

7. A lithographic apparatus comprising:
 a substrate support configured to support a substrate;
 a projection system configured to transfer a pattern from a patterning device onto the substrate; and
 a measurement apparatus configured to measure a characteristic of the substrate, the measurement apparatus comprising
  a pulsed light source configured to illuminate a target on the substrate, the duration of a single light pulse being less than 100 psec and a repetition rate of the pulsed light source is within a range of 10-100 MHz, and
  a detector configured to obtain a reflected image from the target during a linear scanning movement of the substrate, wherein the linear scanning movement of the substrate is a steady, single speed of movement without acceleration or deceleration.

8. A method for measuring of a characteristic of a substrate, comprising:
 obtaining a reflected image of a target on the substrate during a linear scanning movement of the substrate using a pulsed light source, the duration of a single light pulse being less than 100 psec and a repetition rate of the pulsed light source is within a range of 10-100 MHz, wherein the linear scanning movement of the substrate is a steady, single speed of movement without acceleration or deceleration.

9. A device manufacturing method comprising:
 transferring a pattern from a patterning device onto a substrate; and
 measuring a characteristic of the substrate by obtaining a reflected image of a target on the substrate during a linear scanning movement of the substrate using a pulsed light source, the duration of a single light pulse being less than 100 psec and a repetition rate of the pulsed light source is within a range of 10-100 MHz, wherein the linear scanning movement of the substrate is a steady, single speed of movement without acceleration or deceleration.

* * * * *